United States Patent
Lee

(10) Patent No.: US 7,352,644 B2
(45) Date of Patent: Apr. 1, 2008

(54) SEMICONDUCTOR MEMORY WITH RESET FUNCTION

(75) Inventor: Ihl-Ho Lee, Ichon-shi (KR)

(73) Assignee: Hynix Semiconductor, Inc., Kyungki-do (KR)

( * ) Notice: Subject to any disclaimer, the term of this patent is extended or adjusted under 35 U.S.C. 154(b) by 0 days.

(21) Appl. No.: 11/531,370

(22) Filed: Sep. 13, 2006

(65) Prior Publication Data

US 2007/0070728 A1    Mar. 29, 2007

Related U.S. Application Data

(60) Provisional application No. 60/717,075, filed on Sep. 13, 2005.

(51) Int. Cl.
*G11C 7/20* (2006.01)
*G11C 7/22* (2006.01)

(52) U.S. Cl. .................. 365/226; 365/233; 365/230.06

(58) Field of Classification Search ..................... None
See application file for complete search history.

(56) References Cited

U.S. PATENT DOCUMENTS

| | | | | |
|---|---|---|---|---|
| 6,762,632 B1 * | 7/2004 | Himpe et al. | ................ | 327/142 |
| 6,826,114 B2 * | 11/2004 | Lee et al. | ................... | 365/233 |
| 6,829,677 B1 * | 12/2004 | Attaway et al. | ............ | 711/106 |
| 7,251,171 B2 * | 7/2007 | Nishimura et al. | ......... | 365/191 |

* cited by examiner

*Primary Examiner*—Amir Zarabian
*Assistant Examiner*—Michael Weinberg
(74) *Attorney, Agent, or Firm*—Townsend and Townsend and Crew LLP

(57) ABSTRACT

A synchronous dynamic random access memory (SDRAM) integrated circuit (IC) configured to receive an external Reset signal for resetting the IC includes an input buffer configured to generate a buffered reset signal RST from the external Reset signal. The SDRAM IC further includes a reset circuit is configured to generate an internal reset signal Reset_En from (a) the RST signal, (b) a clock enable signal CKE which indicates a time when the SDRAM is ready to receive an external command, and (c) a mode register programming signal $MRS_P$ which indicates a time when a mode register is to be loaded with data.

40 Claims, 4 Drawing Sheets

SEMICONDUCTOR MEMORY WITH RESET FUNCTION

CROSS-REFERENCES TO RELATED APPLICATIONS

This application claims the benefit of U.S. Provisional Application No. 60/717,075, filed Sep. 13, 2005, which disclosure is incorporated by reference in its entirety for all purposes.

BACKGROUND OF THE INVENTION

The present invention relates in general to semiconductor integrated circuits (ICs) and more particularly to a reset function in synchronous dynamic random access memories (SDRAMs).

When using personal computers (PCs) or laptop computers, users typically reset the computer upon encountering such unexpected events as a conflict between programs, a virus attack or infection, or a screen hold. To reset the computer, the user typically powers down the computer and then powers it back up. This process takes a significant amount of time as it usually involves rebooting of the computer. Thus, a technique which enables the user to quickly reset the computer without the need to power down the computer is desirable.

BRIEF SUMMARY OF THE INVENTION

In accordance with an embodiment of the invention, a synchronous dynamic random access memory (SDRAM) integrated circuit (IC) configured to receive an external Reset signal for resetting the IC includes an input buffer configured to generate a buffered reset signal RST from the external Reset signal. The SDRAM IC further includes a reset circuit is configured to generate an internal reset signal Reset_En from (a) the RST signal, (b) a clock enable signal CKE which indicates a time when the SDRAM is ready to receive an external command, and (c) a mode register programming signal $MRS_P$ which indicates a time when a mode register is to be loaded with data.

In one embodiment, the reset circuit activates the Reset_En signal in response to the external Reset signal becoming active to thereby start an internal reset interval during which one or more circuit blocks in the SDRAM IC are powered down. In another embodiment, a duration of the internal reset interval is dependent on when the CKE signal becomes active to indicate that the SDRAM is ready to receive an external command.

In another embodiment, a duration of the internal reset interval is dependent on when the CKE signal becomes active to indicate SDRAM internal initialization is completed.

In another embodiment, the reset circuit comprises a delay circuit configured so that a duration of the Internal Reset Interval is in part dependent upon the propagation delay through the delay circuit.

In another embodiment, an input of the delay circuit is coupled to the CKE signal.

In another embodiment, the reset circuit further comprises a latch circuit configured to prevent the Reset_En signal from changing states when CKE signal makes transitions during predetermined timing periods.

In another embodiment, the reset circuit further comprises a latch circuit configured to render the Reset_En signal non-responsive to CKE signal transitions during the time the external Reset signal is in inactive state.

In another embodiment, the reset circuit further comprises a pull-up circuit configured to bias the latch circuit in a first state in response the MRSP signal becoming active, the first state of the latch circuit rendering the Reset_En signal non-responsive to CKE signal transitions during the time the external Reset signal is in inactive state.

In another embodiment, the input buffer is a low voltage CMOS buffer comprising a two-input logic gate having one input coupled to a supply voltage and the other input coupled to the external Reset signal.

In another embodiment, the reset circuit includes a first two-input NAND gate providing the Reset_En signal at its output and receiving the RST signal at a first input. A second two-input NAND gate has an output coupled to a second input of the first two-input NAND gate, and has a first input coupled to a clock enable signal CKE through an inverting delay circuit. A two-input NOR gate receives the RST signal at a first input and the CKE signal at a second input. A pull-up transistor and a pull-down transistor are serially coupled between a supply voltage and a ground potential, and the pull-down transistor has a gate terminal coupled to an output of the two-input NOR gate. An inverter has its input coupled to the $MRS_P$ signal and its output coupled to a gate terminal of the pull-up transistor. A latch circuit is coupled between a second input of the second two-input NAND gate and a node intermediate serially connected pull-up and pull-down transistors.

In accordance with another embodiment of the invention, a semiconductor memory includes an input buffer configured to generate a buffered reset signal RST from an external Reset signal. A first two-input NAND gate is configured to provide an internal reset signal Reset_En at its output and receive the RST signal at a first input. A second two-input NAND gate has an output coupled to a second input of the first two-input NAND gate, and a first input coupled to the CKE signal through an inverting delay circuit. A two-input NOR gate receives the RST signal at a first input and the CKE signal at a second input, the CKE signal indicating a time when the memory is ready to receive an external command. A pull-up transistor and a pull-down transistor are serially coupled between a supply voltage and a ground potential. The pull-down transistor has a gate terminal coupled to an output of the two-input NOR gate. A inverter has its input coupled to a mode register programming signal $MRS_P$ and its output coupled to a gate terminal of the pull-up transistor. The $MRS_P$ signal indicates a time when a mode register in the memory is to be loaded with data. A latch circuit is coupled between a second input of the second two-input NAND gate and a node intermediate serially connected pull-up and pull-down transistors. The Reset_En signal becomes active in response to the external Reset signal becoming active to thereby start an internal reset interval during which one or more circuit blocks in the memory are powered down.

In one embodiment, a duration of the internal reset interval is dependent on when the CKE signal becomes active to indicate that the memory is ready to receive an external command.

In another embodiment, a duration of the internal reset interval is dependent on when the CKE signal becomes active to indicate an internal initialization of the memory is completed.

In another embodiment, a duration of the Internal Reset Interval is in part dependent upon the propagation delay through the delay circuit.

In another embodiment, the latch circuit prevents the Reset_En signal from changing states when the CKE signal makes transitions during predetermined timing periods.

In another embodiment, the latch circuit renders the Reset_En signal non-responsive to CKE signal transitions during the time the external Reset signal is in inactive state.

In another embodiment, the memory further includes a pull-up circuit configured to bias the latch circuit in a first state in response to the $MRS_P$ signal becoming active, the first state of the latch circuit rendering the Reset_En signal non-responsive to CKE signal transitions during the time the external Reset signal is in inactive state.

In another embodiment, the input buffer is a low voltage CMOS buffer comprising a two-input logic gate having one input coupled to the supply voltage and the other input coupled to the external Reset signal.

In accordance with yet another embodiment of the invention, a memory includes a first logic gate configured to receive an external Reset signal and generate an internal Reset_En signal, the first logic gate causing the Reset_En signal to become active in response to the external Reset signal becoming active to thereby start an internal reset interval during which one or more circuit blocks in the memory are powered down. A second logic gate is configured to receive an external clock enable signal CKE, an output terminal of the second logic gate being coupled to an input terminal of the first logic gate, wherein a duration of the internal reset interval is at least in part dependent on when the CKE signal becomes active to indicate that the memory is ready to receive an external command. A latch circuit is coupled between a biasing circuit and an input terminal of the second logic gate, the biasing circuit being configured to bias the latch circuit in a first state in order to maintain the Reset_En signal in active state when both the external Reset signal and the CKE signal are in inactive state.

In one embodiment, the biasing circuit includes a pull-down circuit configured to bias the latch circuit in the first state when the external Reset signal is active and the CKE signal is inactive.

In another embodiment, the pull-down circuit includes a two-input NOR gate configured to receive the external Reset signal at a first input terminal and the CKE signal at a second input terminal, and a pull-down transistor coupled between the latch circuit and a ground potential, the pull-down transistor having a gate terminal coupled to an output of the two-input NOR gate.

In another embodiment, the biasing circuit is further configured to bias the latch circuit in a second state opposite the first state in order to render the Reset_En signal non-responsive to CKE signal transitions during the time the external Reset signal is in inactive state.

In another embodiment, the biasing circuit includes a pull-up circuit configured to bias the latch circuit in the second state in response to a mode register programming signal MRSP becoming active, the MRSP becoming active indicating that a mode register in the memory is to be loaded with data.

In another embodiment, the pull-up circuit includes a pull-up transistor coupled between a supply voltage and the latch circuit, and an inverter having an input terminal configured to receive MRSP signal, and an output terminal coupled to a gate terminal of the pull-up transistor.

In another embodiment, the second logic gate receives the CKE signal through a delay circuit, wherein a duration of the Internal Reset Interval is in part dependent upon the propagation delay through the delay circuit.

In accordance with another embodiment of the invention, a method of resetting a memory without powering down the memory is as follows. An internal resent signal Reset_En is caused to become active when an external Reset signal becomes active, thereby starting an internal reset interval during which one or more circuit blocks in the memory are powered down. The internal reset interval is terminated when an external clock enable signal CKE becomes active indicating that the memory is ready to receive an external command. A latch circuit is biased in a first state in order to maintain the Reset_En signal in active state when both the external Reset signal and the CKE signal are in inactive state.

In one embodiment, the latch circuit is biased in the first state when the external Reset signal is active and the CKE signal is inactive.

In another embodiment, the latch circuit is biased in a second state opposite the first state in order to render the Reset_En signal non-responsive to CKE signal transitions during the time the external Reset signal is in inactive state.

In another embodiment, the latch circuit is biased in the second state in response to a mode register programming signal $MRS_P$ becoming active, the $MRS_P$ signal becoming active indicating that a mode register in the memory is to be loaded with data.

A further understanding of the nature and the advantages of the invention disclosed herein may be realized by reference to the remaining portions of the specification and the attached drawings.

DETAILED DESCRIPTION OF THE INVENTION

In accordance with an embodiment of the invention, a semiconductor memory IC, such as a synchronous dynamic random access memory (DRAM) and its varieties (e.g., DDR2 and DDR3), includes a logic block coupled to an external reset pin which enables a user to reset the memory IC without the need to power down the IC.

Figure 1:
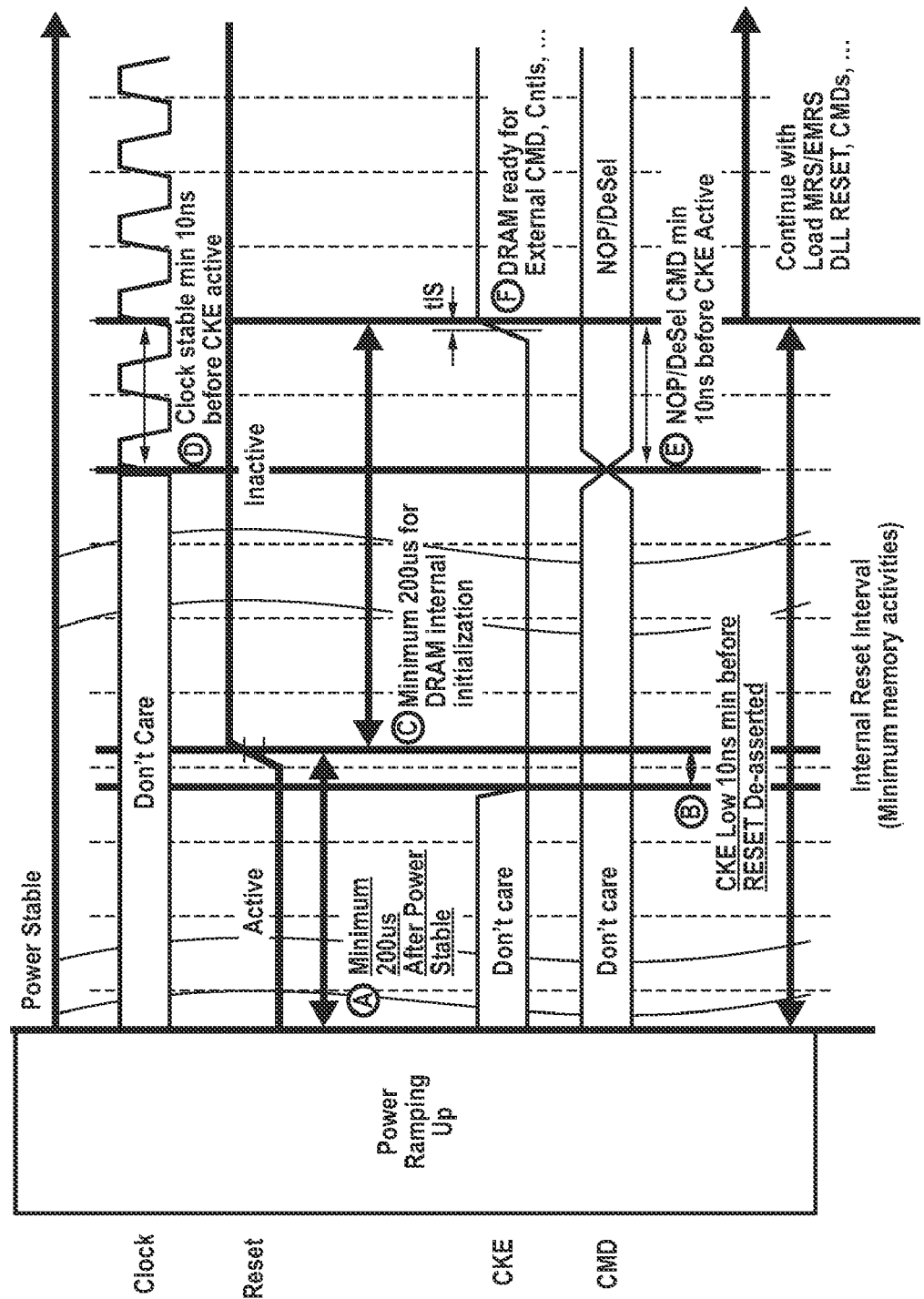
FIG. 1 is a timing diagram showing a reset timing sequence during power up of a memory.
Figure 2:
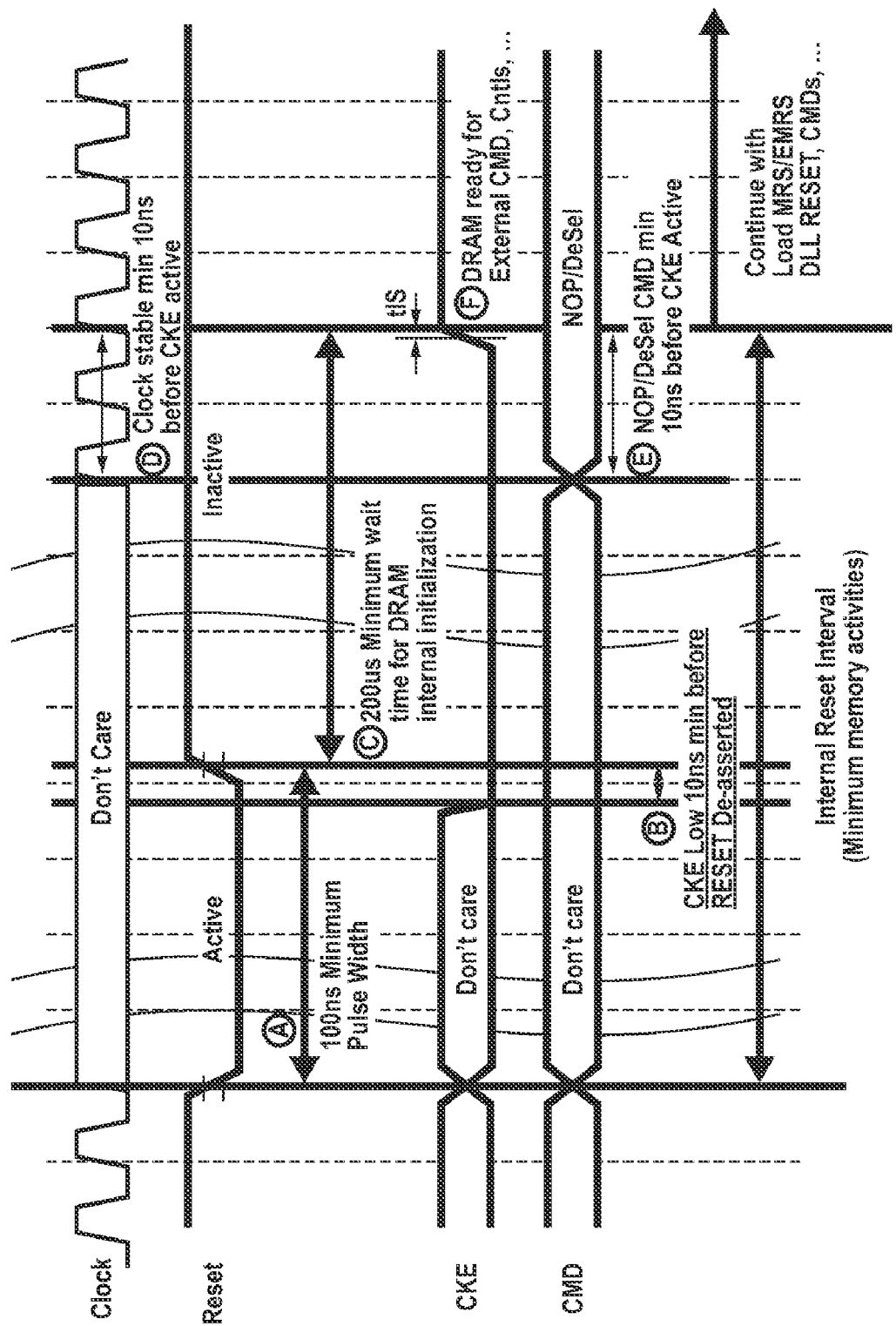
FIG. 2 is a timing diagram showing a reset timing sequence during normal operation of the memory.

FIGS. 1 and 2 are timing diagrams showing reset timing sequences during power up and during normal operation, respectively. In these figures, multiple cycles of the external Clock, Reset, clock enable CKE, and command CMD signals are shown. In FIGS. 1 and 2, the external Reset signal is required to remain active for a minimum duration of time (period A). Further, the CKE signal is required to be inactive (i.e., remain in low state) at least for a predetermined period B before and a predetermined period C after the external Reset signal is raised high. While the external Reset signal becomes inactive at the end of period A, the internal reset period does not end until CKE signal becomes active (i.e., is raised high) signaling the time when the memory IC is ready to receive commands. The time period from when the Reset signal is activated until the time CKE signal goes high is indicated in FIGS. 1 and 2 as the "Internal Reset Interval." During the Internal Reset Interval, many of the circuit blocks in the memory device (e.g., output drivers DQ/DQS, self refresh, on-die termination, DLL) are disabled and thus there are minimum memory activities.

Figure 3:
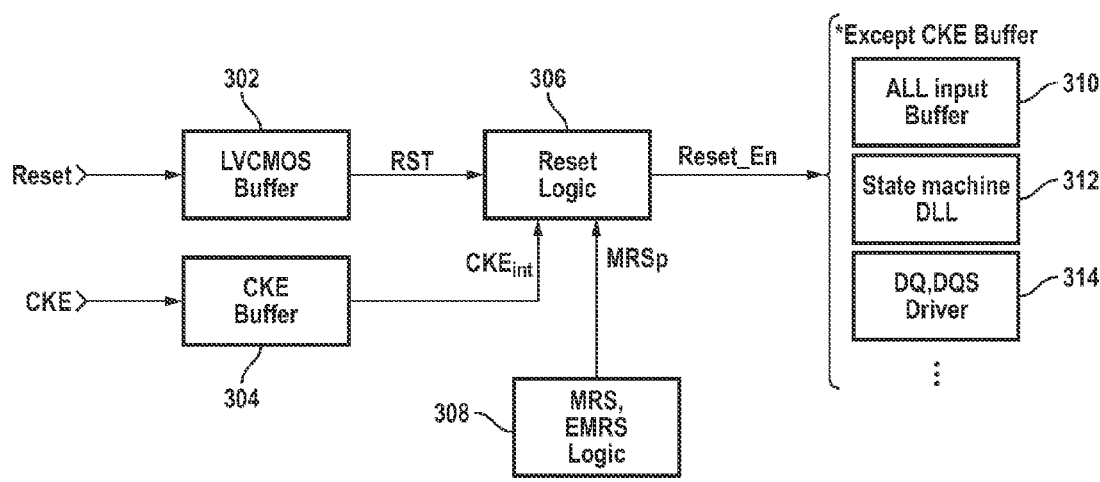
FIG. 3 is a block diagram for an implementation of the timing diagrams in FIGS. 1 and 2, in accordance with an embodiment of the invention.

FIG. 3 shows a block diagram for an implementation of the timing diagrams in FIGS. 1 and 2, in accordance with an embodiment of the invention. A low voltage complementary metal oxide semiconductor (LVCMOS) buffer 302 outputs a RST signal in response to the externally provided Reset signal. A clock enable buffer 304 outputs an internal clock enable signal $CKE_{int}$ in response to externally provided clock enable signal CKE. An MRS, EMRS Logic block 308 outputs a mode register programming signal MRSp in response to externally provided signals (not shown) required to issue a mode register programming signal (in one embodiment, the external signals may include all or a subset of $\overline{CS}$, $\overline{RAS}$, $\overline{CAS}$, $\overline{WE}$, and band addresses BA). A reset logic block 306 receives the RST signal as well as the internal clock enable signal $CKE_{int}$ and the mode register programming signal MRSp, and in response generates a Reset_En signal. The internal Reset_En signal is used to disable specific circuit blocks including the output DQ/DQS drivers, on-die termination (ODT), self-refresh, DLL and a state machine, to thereby minimize power consumption during the reset mode.

Figure 4:
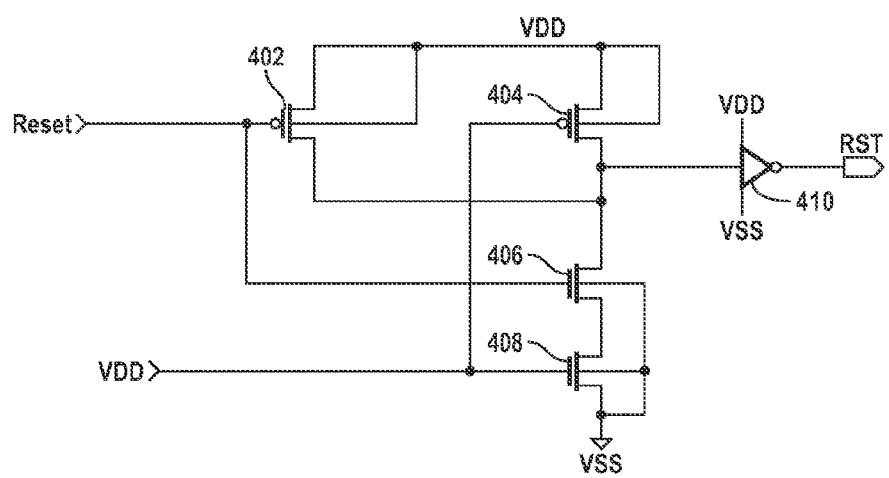
FIG. 4 shows the internal circuitry of the LVCMOS buffer in FIG. 3.

FIG. 4 shows one circuit implementation of the LVCMOS buffer of FIG. 3. The buffer includes a CMOS implementation of a 2-input NAND gate which receives the external Reset signal and the power supply VDD at its two inputs. The output of the NAND gate is inverted via an inverter 410. The output of the inverter provides the RST signal. Use of the NAND gate with an input coupled to VDD helps reduce standby leakage. While the buffer in FIG. 4 is intended to detect CMOS input levels, the buffer can be modified by one skilled in this art to detect other input levels.

Figure 5:
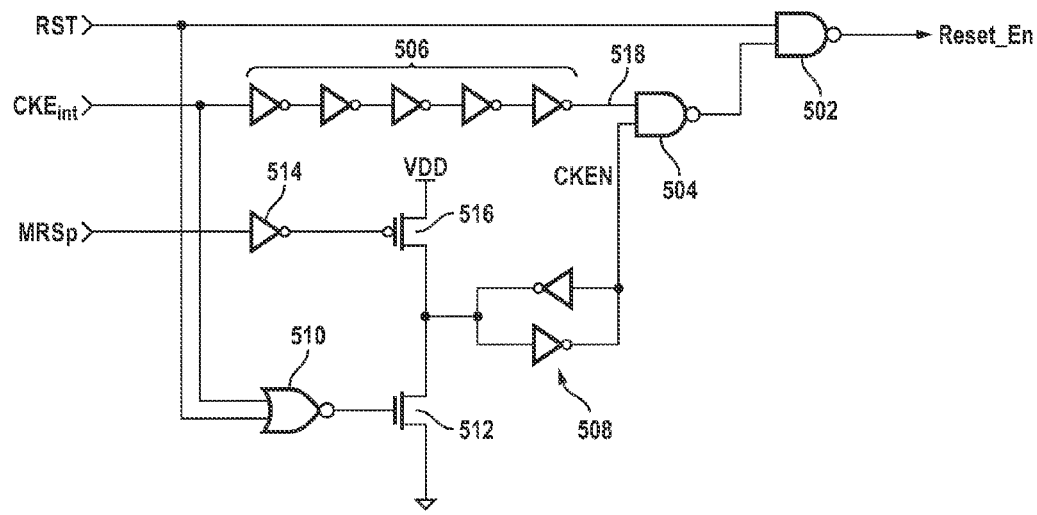
FIG. 5 shows the internal circuitry of the Reset Logic block in FIG. 3 in accordance with an embodiment of the invention.

FIG. 5 shows the internal circuitry of the reset logic block 306 in FIG. 3 in accordance with an embodiment of the invention. Two-input NAND gate 502 receives the RST signal and the output signal generated by another two-input NAND gate 504, and in response generates output signal Reset_En. NAND gate 504 receives the CKE signal via a delay circuit 506 and receives latch signal CKEN from latch circuit 508. Delay chain 506 is made up of an odd number of inverters (e.g., five as shown in the FIG. 5 embodiment), and is thus an inverting delay chain. A latch circuit 506 (e.g., comprising two cross-coupled inverters) is coupled between an input of NAND gate 504 and a biasing circuit. The biasing circuit serves to bias latch circuit 508 to the appropriate states during and after the Internal Reset Interval.

The biasing circuit includes a pull-down circuit which in turn includes a two-input NOR gate 510 and a pull-down transistor 512. The two-input NOR gate 510 receives RST and $CKE_{int}$ signals at its respective input terminals, and the output terminal of NOR gate 510 is coupled to the gate of pull-down transistor 512. Pull-down transistor 512 is coupled between latch circuit 508 and ground potential. The biasing circuit further includes a pull-up circuit which in turn includes an inverter 514 and a pull-up transistor 516. Inverter 514 receives the $MRS_P$ signal at its input, and the output of inverter 514 is coupled to the gate of pull-up transistor 516. Pull-up transistor 516 and pull-down transistor 512 are serially coupled between VDD and ground. The node intermediate transistors 512 and 516 are connected to latch 508. As shown, pull-down transistor 512 is an NMOS transistor and pull-up transistor 516 is a PMOS transistor, but they are not limited as such.

Figure 6:
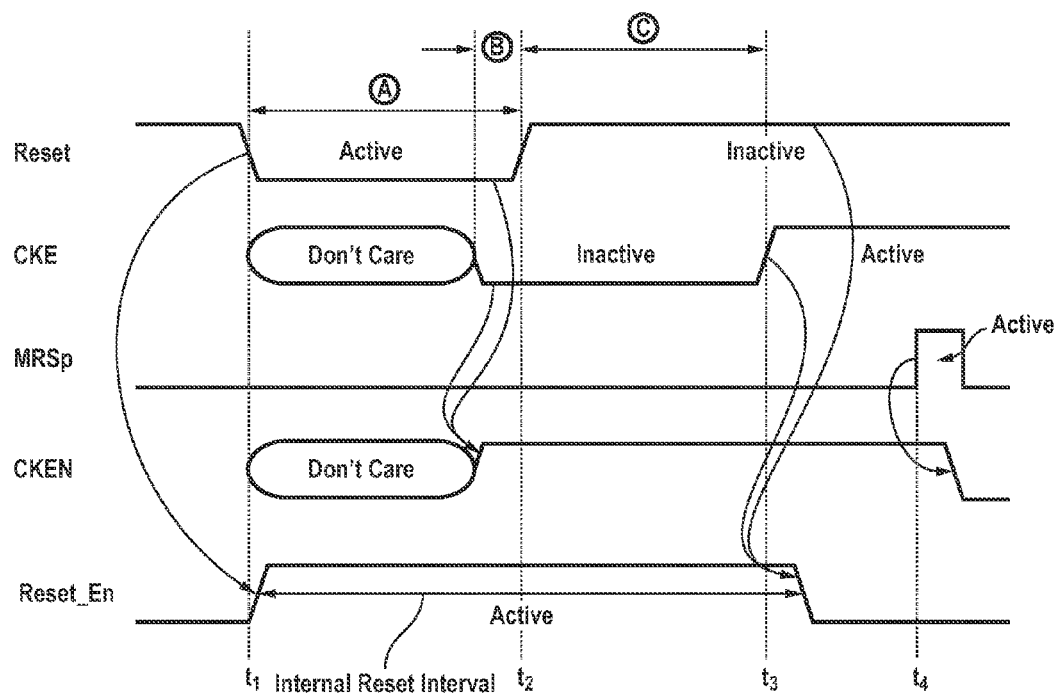
FIG. 6 is a timing diagram used to illustrate the operation of the circuit in FIG. 5.

FIG. 6 is a timing diagram which will be used to describe the operation of the circuit in FIG. 5. The timing of the Reset and CKE signals in FIG. 6 correspond to those in FIGS. 1 and 2. A pulse signal ($MRS_P$) generated by the MRS, EMRS Logic block (FIG. 3) initiates the mode register programming operation known in SDRAM devices. The waveform shown for CKEN signal reflects the timing at the input of NAND gate 504. Upon power-up or when Reset is activated during normal operation, the Reset, CKE, and $MRS_P$ signals occur in the sequence shown in FIG. 6.

When the external Reset signal is asserted low (i.e., becomes active) at time t1 by for example a user, the internal Reset_En signal is driven high (i.e., becomes active) via NAND gate 502 thus initiating the Internal Reset Interval during which a predetermined number of circuit blocks in the memory are powered down. The Internal Reset Interval ends when both inputs of NAND gate 502 are at a high level. Thus, with the Reset signal raised high at time t2 (i.e., Reset signal becomes inactive), the Internal Reset Interval remains active until a predetermined time delay after CKE goes high (i.e., becomes active) at time t3. That is, with the Reset signal in the inactive state, when CKE signal becomes active at time t3, output 518 of delay circuit 506 goes low after a time period corresponding to the propagation delay through inverter chain 506. Output of NAND gate 504 transitions high in response to the low transition at node 518, thus causing Reset_En signal to transition low terminating the Internal Reset Interval. Delay chain 506, in effect, extends the Internal Reset Interval.

During the B time period when the CKE signal is inactive and the Reset signal is active (i.e., are both low), NOR gate 510 turns on pull-down transistor 512, thus causing latch 508 to either maintain a high at the node marked as CKEN or pull node CKEN high if it was previously in the low state. This ensures that during time period C when both CKE and Reset signals are in inactive state, the Reset_En signal is maintained in the active state. At time t4 when the $MRS_P$ pulse is generated to initiate the mode register programming, the high going edge of the $MRS_P$ pulse causes pull-up transistor 516 to turn on thus causing the CKEN node to transition low. Latch circuit 508 maintains the CKEN node low until both Reset and CKE signals become low again. During the time CKEN node is low, NAND gate 504 prevents the CKE signal transitions from impacting the state of Reset_En signal. Thus, the $MRS_P$ pulse after the external CKE signal becomes active ensures that during the time the external Reset signal is high, transitions in external CKE signal do not impact the state of the internal RESET_EN signal.

Thus, in accordance with an embodiment of the invention, a simple reset circuit implemented in a SDRAM enables the SDRAM to be reset via an external Reset pin without the need to power down the SDRAM. The reset circuit uses only 3 input signals to implement the reset function. This feature advantageously enables resetting a PC or laptop computers when certain malfunctions occur without the need to power down the PC.

While the above provides a detailed description of various embodiments of the invention, many alternatives, modifications, and equivalents are possible. For this and other reasons, therefore, the above description should not be taken as limiting the scope of the invention as defined by the claims.

What is claimed is:

1. A synchronous dynamic random access memory (SDRAM) integrated circuit (IC) configured to receive an external Reset signal for resetting the IC, the SDRAM IC comprising:
an input buffer configured to generate a buffered reset signal RST from the external Reset signal; and
a reset circuit configured to generate an internal reset signal Reset_En from (a) the RST signal, (b) a clock enable signal CKE which indicates a time when the SDRAM is ready to receive an external command, and (c) a mode register programming signal $MRS_P$ which indicates a time when a mode register is to be loaded with data.

2. The SDRAM IC of claim 1 wherein the reset circuit activates the Reset_En signal in response to the external Reset signal becoming active to thereby start an internal reset interval during which one or more circuit blocks in the SDRAM IC are powered down.

3. The SDRAM IC of claim 2 wherein a duration of the internal reset interval is dependent on when the CKE signal becomes active to indicate that the SDRAM is ready to receive an external command.

4. The SDRAM IC of claim 2 wherein a duration of the internal reset interval is dependent on when the CKE signal becomes active to indicate SDRAM internal initialization is completed.

5. The SDRAM IC of claim 2 wherein the reset circuit comprises a delay circuit configured so that a duration of the Internal Reset Interval is in part dependent upon the propagation delay through the delay circuit.

6. The SDRAM IC of claim 5 wherein an input of the delay circuit is coupled to the CKE signal.

7. The SDRAM IC of claim 2 wherein the reset circuit further comprises a latch circuit configured to prevent the Reset_En signal from changing states when CKE signal makes transitions during predetermined timing periods.

8. The SDRAM IC of claim 2 wherein the reset circuit further comprises a latch circuit configured to render the Reset_En signal non-responsive to CKE signal transitions during the time the external Reset signal is in inactive state.

9. The SDRAM IC of claim 2 wherein the reset circuit further comprises a pull-up circuit configured to bias the latch circuit in a first state in response the $MRS_P$ signal becoming active, the first state of the latch circuit rendering the Reset_En signal non-responsive to CKE signal transitions during the time the external Reset signal is in inactive state.

10. The SDRAM IC of claim 1 wherein the input buffer is a low voltage CMOS buffer comprising a two-input logic gate having one input coupled to a supply voltage and the other input coupled to the external Reset signal.

11. The SDRAM IC of claim 1 wherein the reset circuit comprises:
a first two-input NAND gate providing the Reset_En signal at its output and receiving the RST signal at a first input;
a second two-input NAND gate having an output coupled to a second input of the first two-input NAND gate, the second two-input NAND gate having a first input coupled to a clock enable signal CKE through an inverting delay circuit;
a two-input NOR gate receiving the RST signal at a first input and the CKE signal at a second input;
a pull-up transistor and a pull-down transistor serially coupled between a supply voltage and a ground potential, the pull-down transistor having a gate terminal coupled to an output of the two-input NOR gate;
an inverter having its input coupled to the $MRS_P$ signal and its output coupled to a gate terminal of the pull-up transistor; and
a latch circuit coupled between a second input of the second two-input NAND gate and a node intermediate serially connected pull-up and pull-down transistors.

12. The SDRAM IC of claim 11 wherein the latch circuit comprises two cross-coupled inverters.

13. A memory comprising:
an input buffer configured to generate a buffered reset signal RST from an external Reset signal;
a first two-input NAND gate providing an internal reset signal Reset_En at its output and receiving the RST signal at a first input;
a second two-input NAND gate having an output coupled to a second input of the first two-input NAND gate, the second two-input NAND gate having a first input coupled to the CKE signal through an inverting delay circuit;
a two-input NOR gate receiving the RST signal at a first input and the CKE signal at a second input, the CKE signal indicating a time when the memory is ready to receive an external command;
a pull-up transistor and a pull-down transistor serially coupled between a supply voltage and a ground potential, the pull-down transistor having a gate terminal coupled to an output of the two-input NOR gate;
an inverter having its input coupled to a mode register programming signal $MRS_P$ and its output coupled to a gate terminal of the pull-up transistor, the $MRS_P$ signal indicating a time when a mode register in the memory is to be loaded with data; and
a latch circuit coupled between a second input of the second two-input NAND gate and a node intermediate serially connected pull-up and pull-down transistors,
wherein the Reset_En signal becomes active in response to the external Reset signal becoming active to thereby start an internal reset interval during which one or more circuit blocks in the memory are powered down.

14. The memory of claim 13 wherein a duration of the internal reset interval is dependent on when the CKE signal becomes active to indicate that the memory is ready to receive an external command.

15. The memory of claim 13 wherein a duration of the internal reset interval is dependent on when the CKE signal becomes active to indicate an internal initialization of the memory is completed.

16. The memory of claim 13 wherein a duration of the Internal Reset Interval is in part dependent upon the propagation delay through the delay circuit.

17. The memory of claim 13 wherein the latch circuit prevents the Reset_En signal from changing states when the CKE signal makes transitions during predetermined timing periods.

18. The memory of claim 13 wherein the latch circuit renders the Reset_En signal non-responsive to CKE signal transitions during the time the external Reset signal is in inactive state.

19. The memory of claim 13 further comprising a pull-up circuit configured to bias the latch circuit in a first state in response to the $MRS_P$ signal becoming active, the first state of the latch circuit rendering the Reset_En signal non-responsive to CKE signal transitions during the time the external Reset signal is in inactive state.

20. The memory of claim 13 wherein the input buffer is a low voltage CMOS buffer comprising a two-input logic gate having one input coupled to the supply voltage and the other input coupled to the external Reset signal.

21. The memory of claim 13 wherein the latch circuit comprises two cross-coupled inverters.

22. The memory of claim 13 wherein the memory is a SDRAM.

23. A memory comprising:
a first logic gate configured to receive an external Reset signal and generate an internal Reset_En signal, the first logic gate causing the Reset_En signal to become active in response to the external Reset signal becoming active to thereby start an internal reset interval during which one or more circuit blocks in the memory are powered down;
a second logic gate being configured to receive an external clock enable signal CKE, an output terminal of the second logic gate being coupled to an input terminal of the first logic gate, wherein a duration of the internal reset interval is at least in part dependent on when the CKE signal becomes active to indicate that the memory is ready to receive an external command; and
a latch circuit coupled between a biasing circuit and an input terminal of the second logic gate, the biasing circuit being configured to bias the latch circuit in a first state in order to maintain the Reset_En signal in active state when both the external Reset signal and the CKE signal are in inactive state.

24. The memory of claim 23 wherein the biasing circuit comprises a pull-down circuit configured to bias the latch circuit in the first state when the external Reset signal is active and the CKE signal is inactive.

25. The memory of claim 24 wherein the pull-down circuit comprises:
a two-input NOR gate configured to receive the external Reset signal at a first input terminal and the CKE signal at a second input terminal; and
a pull-down transistor coupled between the latch circuit and a ground potential, the pull-down transistor having a gate terminal coupled to an output of the two-input NOR gate.

26. The memory of claim 23 wherein the biasing circuit is further configured to bias the latch circuit in a second state opposite the first state in order to render the Reset_En signal non-responsive to CKE signal transitions during the time the external Reset signal is in inactive state.

27. The memory of claim 25 wherein the biasing circuit comprises a pull-up circuit configured to bias the latch circuit in the second state in response to a mode register programming signal $MRS_P$ becoming active, the $MRS_P$ becoming active indicating that a mode register in the memory is to be loaded with data.

28. The memory of claim 27 wherein the pull-up circuit comprises:
a pull-up transistor coupled between a supply voltage and the latch circuit; and
an inverter having an input terminal configured to receive $MRS_P$ signal, and an output terminal coupled to a gate terminal of the pull-up transistor.

29. The memory of claim 23 wherein the second logic gate receives the CKE signal through a delay circuit, wherein a duration of the Internal Reset Interval is in part dependent upon the propagation delay through the delay circuit.

30. The memory of claim 29 wherein the delay circuit is an inverting delay circuit.

31. The memory of claim 23 wherein first logic gate receives the external Reset signal through a low voltage CMOS input buffer.

32. The memory of claim 31 wherein the low voltage CMOS input buffer comprises a two-input logic gate having one input coupled to a supply voltage and the other input coupled to the external Reset signal.

33. The memory of claim 23 wherein the first and second logic gates are two-input NAND gates.

34. The memory of claim 23 wherein the latch circuit comprises two cross-coupled inverters.

35. The memory of claim 23 wherein the memory is a SDRAM.

36. A method of resetting a memory, the method comprising:
causing an internal reset signal Reset_En to become active when an external Reset signal becomes active, thereby starting an internal reset interval during which one or more circuit blocks in the memory are powered down;
terminating the internal reset interval when an external clock enable signal CKE becomes active indicating that the memory is ready to receive an external command; and
biasing a latch circuit in a first state in order to maintain the Reset_En signal in active state during a time when both the external Reset signal and the CKE signal are in inactive state.

37. The method of claim 36 further comprising biasing the latch circuit in the first state at a time when the external Reset signal is active and the CKE signal is inactive.

38. The method of claim 36 further comprising biasing the latch circuit in a second state opposite the first state in order to render the Reset_En signal non-responsive to CKE signal transitions during the time the external Reset signal is in inactive state.

39. The method of claim 38 wherein the latch circuit is biased in the second state in response to a mode register programming signal $MRS_P$ becoming active, the $MRS_P$ becoming active indicating that a mode register in the memory is to be loaded with data.

40. The method of claim 36 wherein the memory is a SDRAM.

* * * * *